United States Patent
Balan

(10) Patent No.: US 6,642,791 B1
(45) Date of Patent: Nov. 4, 2003

(54) SELF-BIASED AMPLIFIER CIRCUIT AND METHOD FOR SELF-BASING AMPLIFIER CIRCUIT

(75) Inventor: Vishnu Balan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/215,920

(22) Filed: Aug. 9, 2002

(51) Int. Cl.⁷ ................................................. H03F 3/45
(52) U.S. Cl. .................... 330/253; 330/260; 330/259
(58) Field of Search ................................. 330/253, 254, 330/257, 259, 260, 261; 327/52–54, 65–67

(56) References Cited

U.S. PATENT DOCUMENTS 4,992,756 A * 2/1991 Anderson .................... 330/253
5,650,753 A * 7/1997 Ling ........................... 330/253

* cited by examiner

Primary Examiner—Timothy P. Callahan
Assistant Examiner—An T. Luu
(74) Attorney, Agent, or Firm—Thelen, Reid & Priest, LLP

(57) ABSTRACT

An amplifier circuit includes a first input device coupled to a first input node and controlling a first current, a second input device coupled to a second input node and controlling a second current, a current source device coupled to a bias node and controlling a summed current of the first and second currents, a current mirror circuit, a first feedback circuit, a second feedback circuit, and a capacitor. The current mirror circuit generates a load current by mirroring the first current so as to provide an output signal voltage to an output node couple to the second output node. The first feedback circuit supplies a mirrored first current to the bias node, and the second feedback circuit pulls a mirrored second current from the bias node. The capacitor is coupled to the bias node and provides the bias voltage to the current source device.

27 Claims, 4 Drawing Sheets

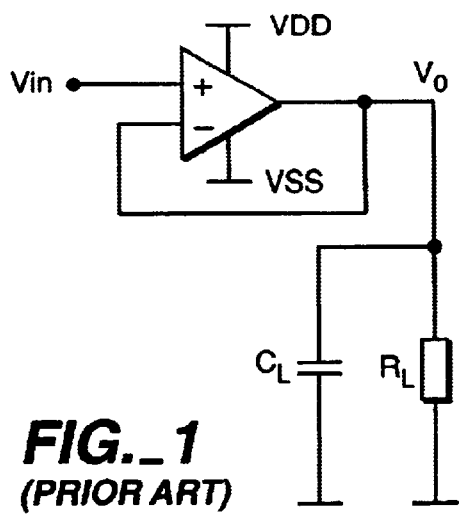
FIG._1
(PRIOR ART)
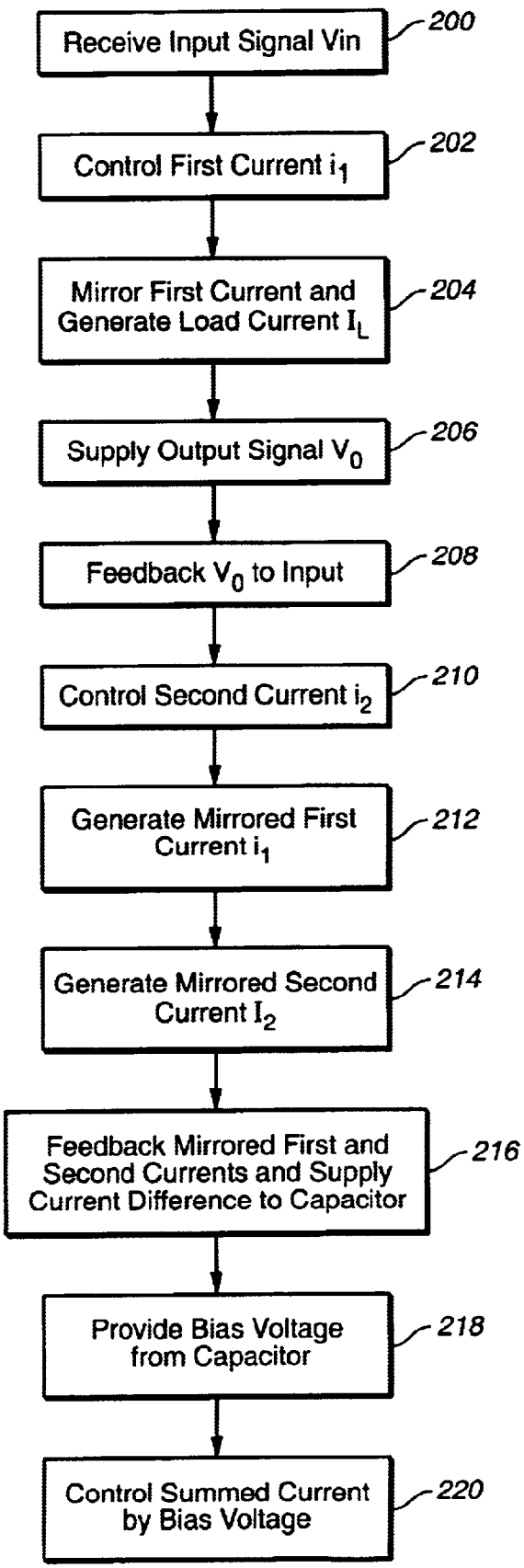
FIG._5

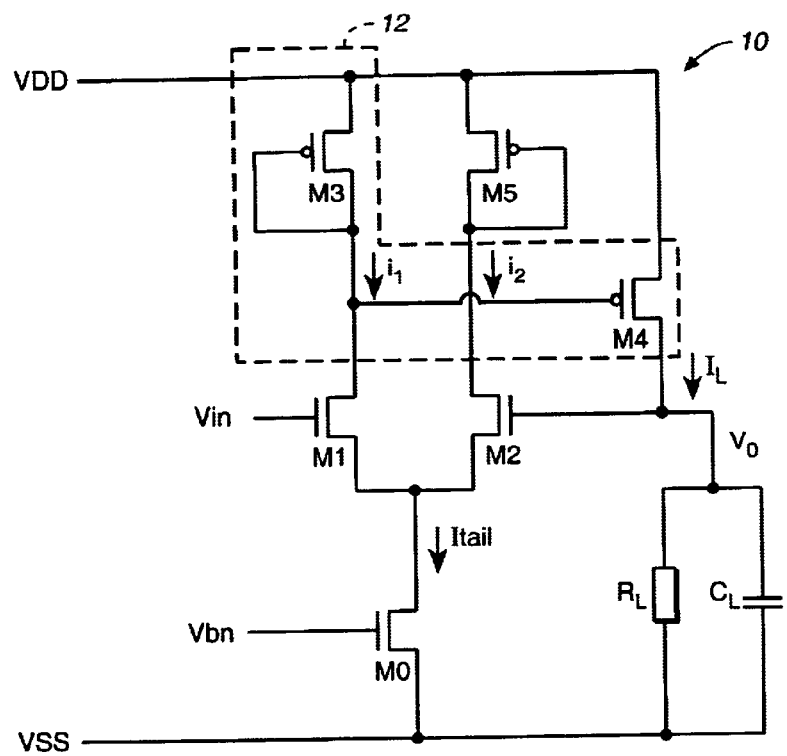
FIG._2A
(PRIOR ART)
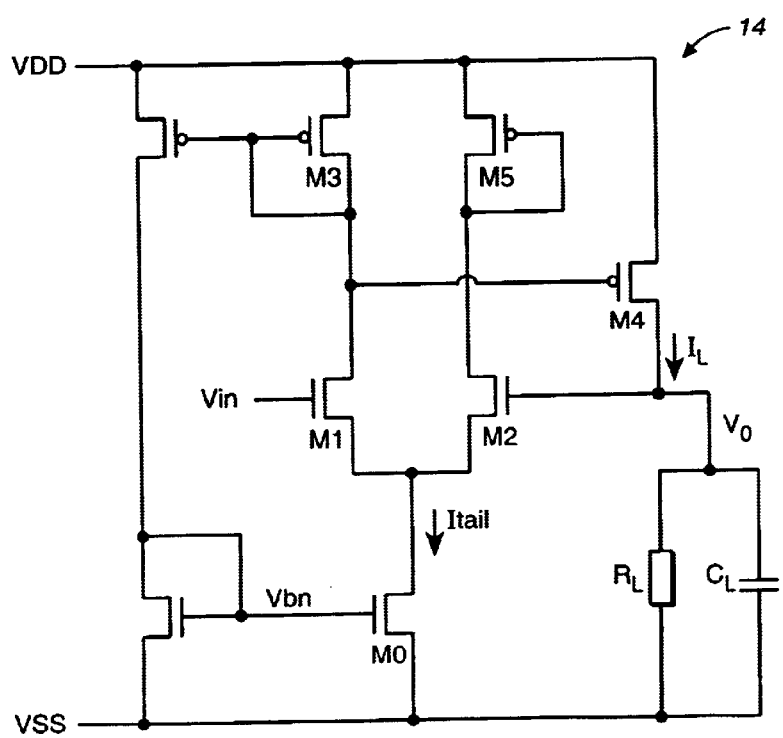
FIG._2B
(PRIOR ART)

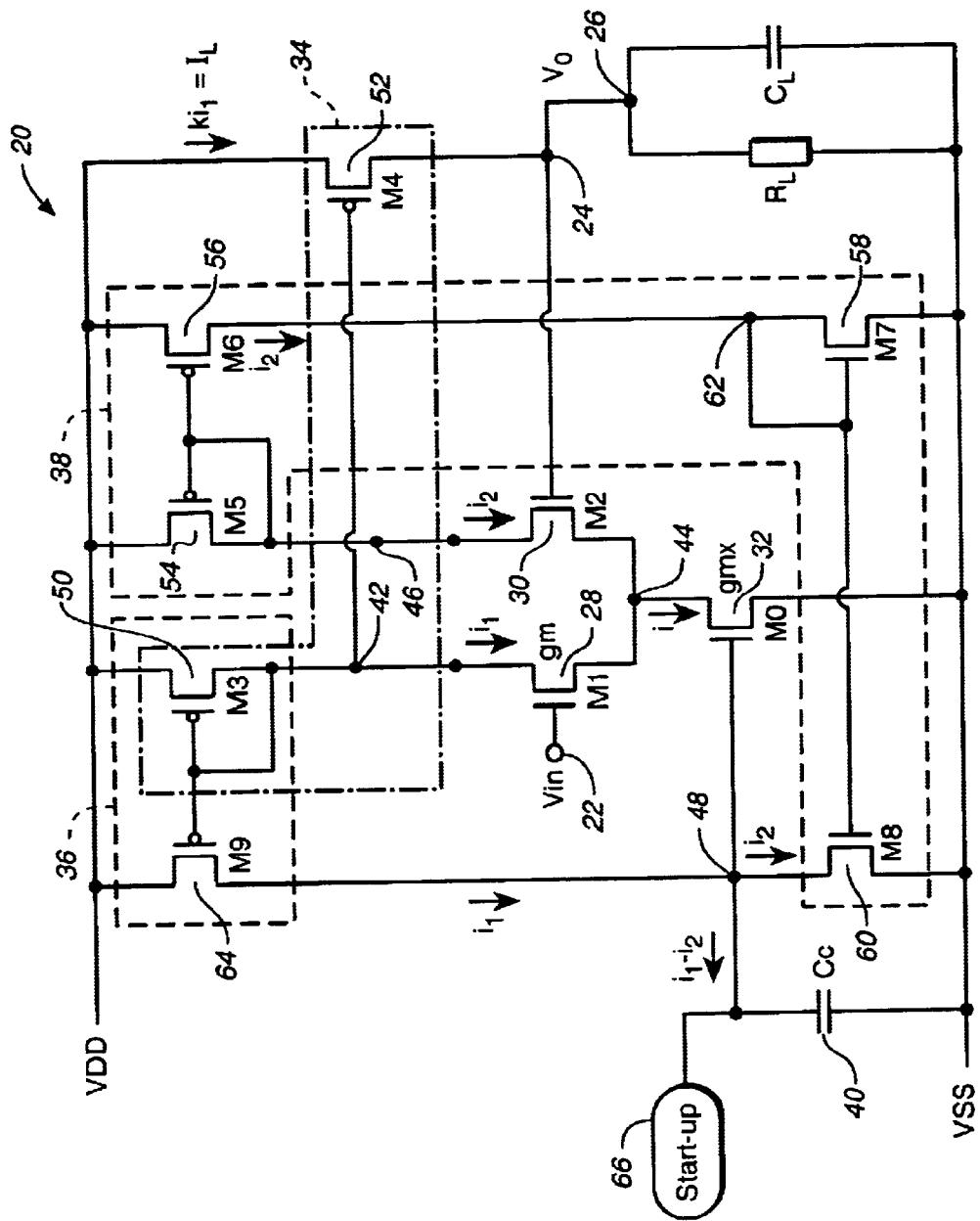
FIG._3

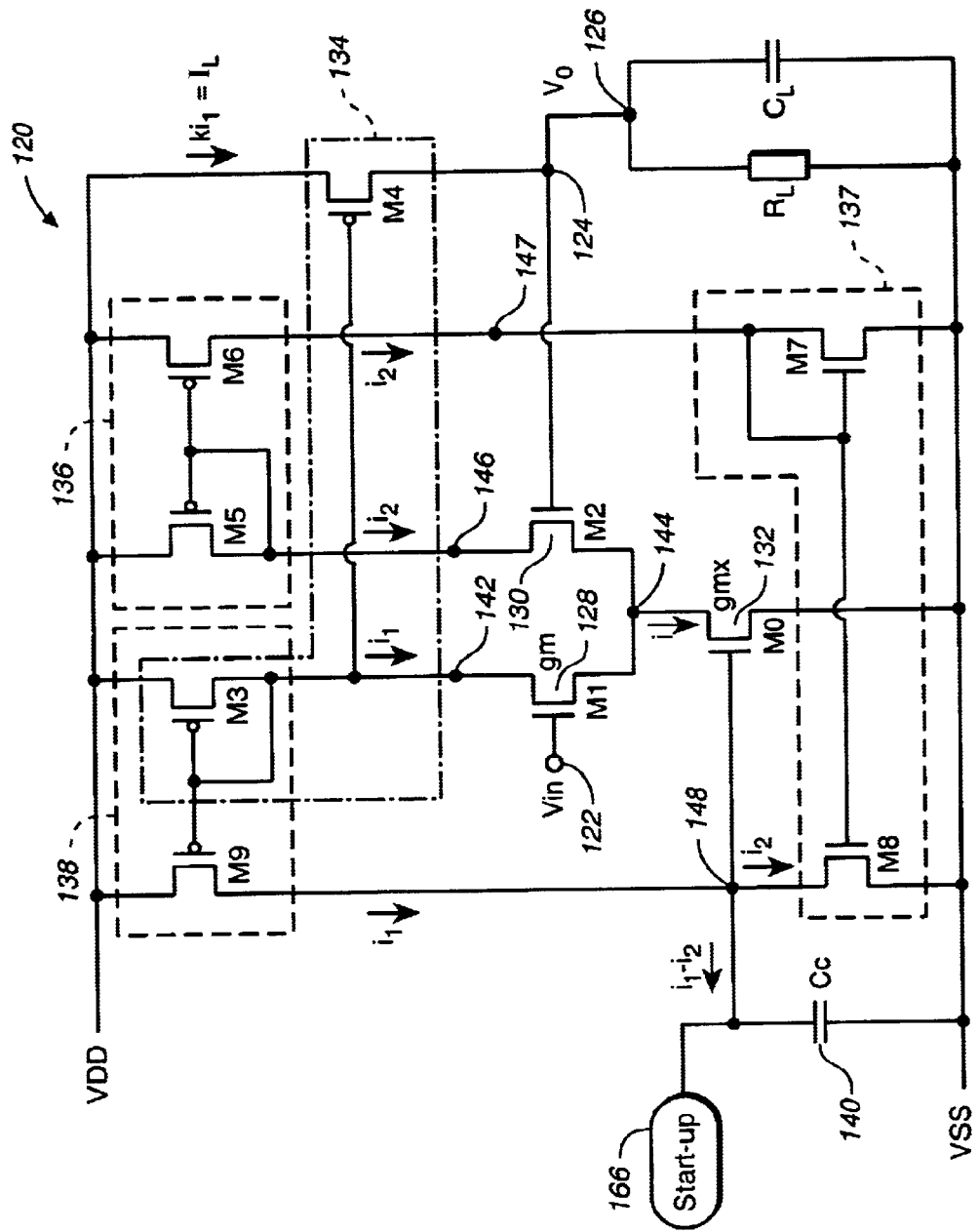
FIG._4

SELF-BIASED AMPLIFIER CIRCUIT AND METHOD FOR SELF-BASING AMPLIFIER CIRCUIT

FIELD OF THE INVENTION

The present invention relates to an amplifier circuit and a method for controlling the same. More particularly, the present invention relates to a self-biased amplifier circuit and a method for self-biasing an amplifier circuit.

BACKGROUND OF THE INVENTION

FIG. 1 schematically illustrates a conventional voltage follower circuit driving a combination of resistive and capacitive loads. As shown in FIG. 1, an input signal ($V_{in}$) is applied to a non-inverting terminal, and an inverting terminal is coupled to an output terminal. There are a number of applications requiring a voltage follower circuit having low output impedance and capable of driving capacitive load. In many cases the load also includes a resistor in parallel with a large capacitor, for example, a resistive ladder in an analog-to-digital converter.

FIG. 2A schematically illustrates an example of a conventional operational amplifier 10 which drives a resistive load $R_L$ and a capacitive load $C_L$. FIG. 2A also depicts an example of how the amplifier 10 could be implemented using the CMOS process (NMOS and PMOS transistors). A typical technique to drive such loads is to use a single-stage operational amplifier which is compensated at its output ($V_o$). As shown in FIG. 2A, the amplifier 10 includes input devices (M1 and M2), and a current mirror circuit 12 which includes two PMOS devices M3 and M4 with the device ratio of 1:k. The current mirror circuit 12 provides a load current $I_L$ at the output terminal, which is ideally the same as a current $i_1$(when k=1) flowing through the input device M1. In general, the load current $I_L$ is expressed as $I_L=k(i_1+\Delta 1)$, where $\Delta 1$ is an offset including a random offset of the devices due to process (and other uncontrollable factors) and a systematic offset.

However, the presence of an equivalent low resistor ($R_L$) at the output terminal lowers the open-loop DC gain of the amplifier 10. The low open-loop DC gain results in poor DC accuracy, which in turn leads to a systematic offset between the input $V_{in}$ and the output $V_o$. For example, if the tail current ($I_{tail}$), which is the sum of the currents flowing through the input devices M1 and M2, is a constant bias current, then the varying load current ($I_L$) with a varying input voltage $V_{in}$(or a varying load resistance $R_L$) results in a varying systematic offset between the input and output. A zero systematic offset only occurs when $$I_{tail} = i_1 + i_2 = \frac{2I_L}{k},$$

Where k is the device ratio of the PMOS transistors M4 to M3 as mentioned above. The DC power supply rejection is also poor because of the finite drain-source conductance $g_{ds}$ of the mirror transistors M3 and M4.

One solution to increase the DC gain is to use a two-stage (or multi-stage) amplifier. The compensation of such multi-stage circuits typically involves the use of floating capacitors (e.g. pole-splitting or nested-miller techniques). However, floating capacitors may not be available in a standard CMOS process. Another solution may be the use of an adaptive biasing technique. FIG. 2B schematically illustrates a conventional amplifier circuit 14 employing such an adaptive biasing. As shown in FIG. 2B, the tail current of the differential pair M1 and M2 is adjusted according to the load current, and this technique also improves the open-loop DC gain performance. However, the amplifier circuit 14 still has a substantial offset because the gain is similar to that of a single-stage amplifier.

BRIEF DESCRIPTION OF THE INVENTION

An amplifier circuit includes a first input device coupled to a first input node and controlling a first current, a second input device coupled to a second input node and controlling a second current, a current source device coupled to a bias node and controlling a summed current of the first and second currents, a current mirror circuit, a first feedback circuit, a second feedback circuit, and a capacitor. The current mirror circuit generates a load current by mirroring the first current so as to provide an output signal voltage to an output node couple to the second output node. The first feedback circuit supplies a mirrored first current to the bias node, and the second feedback circuit pulls a mirrored second current from the bias node. The capacitor is coupled to the bias node and provides the bias voltage to the current source device.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is an electrical schematic diagram illustrating a conventional voltage follower circuit driving a combination of resistive and capacitive loads.

FIG. 2A is an electrical circuit diagram schematically illustrating an example of a conventional operational amplifier driving a resistive load and a capacitive load.

FIG. 2B is an electrical circuit diagram schematically illustrating an example of a conventional operational amplifier employing an adaptive biasing technique.

FIG. 3 is an electrical circuit diagram schematically illustrating a self-biased amplifier circuit in accordance with one embodiment of the present invention.

FIG. 4 is an electrical circuit diagram schematically illustrating a self-biased amplifier circuit in accordance with one embodiment of the present invention.

FIG. 5 is a process flow diagram schematically illustrating a method for self-biasing an amplifier circuit in accordance with one embodiment of the present invention.

DETAILED DESCRIPTION

Embodiments of the present invention are described herein in the context of a self-biased amplifier circuit and a method for self-biasing an amplifier circuit. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 3 schematically illustrates an amplifier circuit (voltage flower circuit) 20 in accordance with one embodiment of the present invention. As shown in FIG. 3, the amplifier circuit 20 includes a first input node 22, a second input node 24, an output node 26 coupled to the second input node 24, a first input device 28, a second input device 30, a current source device 32, a current mirror circuit 34, a first feedback circuit 36, a second feedback circuit 38, and a capacitor 40. Typically, the first input node 22 is couple to a non-inverting terminal and the second input node 24 is coupled to an inverting terminal. The first input device 28 (M1) is coupled to the first input node 22, and controls a first current ($i_1$) flowing from a first supply voltage ($V_{DD}$) through a first node 42 to a summing node 44. The second input device 30 is coupled to the second input node 24, and controls a second current ($i_2$) flowing from the first supply voltage ($V_{DD}$) through a second node 46 to the summing node 44. The current source device 32 (M0) is coupled to a bias node 48, and controls a summed current ($i=i_1+i_2$) flowing from the summing node 44 to a second supply voltage ($V_{SS}$) in accordance with a bias voltage $Vb$. The second supply voltage ($V_{SS}$) may be the ground voltage.

The current mirror circuit 34 is coupled between the first supply voltage ($V_{DD}$) and the first node 42 and to the output node 26. The current mirror circuit 34 generates a load current ($I_L$) mirroring the first current ($i_1$) to provide an output signal voltage ($V_o$) to the output node 26. The first feedback circuit 36 is coupled between the first supply voltage ($V_{DD}$) and the first node 42 and also coupled to the bias node 48. The first feedback circuit 36 supplies a mirrored first current ($i_1$) to the bias node 48, providing a positive feedback to the bias node 48. The second feedback circuit 38 is coupled between the second node 46 and the second supply voltage ($V_{SS}$) and also coupled to the bias node 48. The second feedback circuit 38 pulls a mirrored second current ($i_2$) from the bias node 48, providing a negative feedback to the bias node 48.

The capacitor 40 is coupled between the bias node 48 and the second supply voltage ($V_{SS}$), and provides the bias voltage $Vb$ to the current source device 32. The capacitor 40 receives the electric charge in accordance with the difference between the first current $i_1$ (pushed to the bias node 48) and the second current $i_2$ (pulled from the bias node 48), and provides the bias voltage Vb corresponding to the electric charge held therein. Since the capacitor 40 is charged by the current difference ($i_1-i_2$), the first and second currents are forced to be equal, i.e., $i_1=i_2=i/2$. Since the second current $i_2$ reflects the feedback from the output, i.e., reflects the load, the amplifier circuit 20 is biased according to the load itself, eliminating systematic setoff.

In accordance with one embodiment of the present invention, the first input device 28 is a first metal oxide semiconductor field effect transistor of a first conductivity type (for example, NMOSFET M1). As shown in FIG. 3, a gate of the first transistor 28 (M1) is coupled to the first input node 22, a drain of the first transistor 28 (M1) is coupled to the first node 42, and a source of the first transistor 28 (M1) is coupled to the summing node 44. Similarly, the second input device 30 is a second metal oxide semiconductor field effect transistor of the first conductivity type (for example, NMOSFET M2). A gate of the second transistor 30 (M2) is coupled to the second input node 24, a drain of the second transistor 30 (M2) s coupled to the second node 46, and a source of the second transistor 30 (M2) is coupled to the summing node 44. The current source device 32 is a metal oxide semiconductor field effect transistor of a first conductivity type (for example, NMOSFET M0). A gate of the transistor 32 (M0) is coupled to the bias node 48, a drain of the transistor M0 is coupled to the summing node 44, and a source of the transistor 32 (M0) is coupled to the second supply voltage ($V_{SS}$).

In accordance with one embodiment of the present invention, as shown in FIG. 3, the current mirror circuit 34 includes two devices 50 and 52. The device 50 is a third metal oxide semiconductor field effect transistor of a second conductivity type (for example, PMOSFET M3). A gate and a drain of the third transistor 50 (M3) is coupled to the first node 42, and a source of the third transistor 50 (M3) is coupled to the first supply voltage ($V_{DD}$). The device 52 is a fourth metal oxide semiconductor field effect transistor of the second conductivity type (for example, PMOSFET M4). A gate of the fourth transistor 52 (M4) is coupled to the first node 42, a source of the fourth transistor 52 (M4) is couple to the first supply voltage ($V_{DD}$), and a drain of the fourth transistor 52 (M4) is coupled to the output node 26. Typically, the third transistor 50 (M3) and the fourth transistor 52 (M4) have a device ratio of 1: k, providing the mirrored current $I_L$ of $I_L=k \times i_1$.

In accordance with one embodiment of the present invention, as shown in FIG. 3, the second feedback circuit 38 includes four devices 54, 56, 58, and 60. The device 54 is a fifth metal oxide semiconductor field effect transistor of a second conductivity type (for example, PMOSFET M5). A gate and a drain of the fifth transistor 54 (M5) are coupled to the second node 46, and a source of the fifth transistor 54 (M5) is coupled to the first supply voltage ($V_{DD}$). The device 56 is a sixth metal oxide semiconductor field effect transistor of the second conductivity type (for example, PMOSFET M6). A gate of the sixth transistor 56 (M6) is coupled to the gate of the fifth transistor 54 (M5), a source of the sixth transistor 56 (M6) is couple to the first supply voltage ($V_{DD}$), and a drain of the sixth transistor 56 (M6) is coupled to a third node 62. The device 58 is a seventh metal oxide semiconductor field effect transistor of a first conductivity type (for example, NMOSFET M7). A gate and a drain of the seventh transistor 58 (M7) are coupled to the third node 62, and a source of the seventh transistor 58 (M7) is coupled to the second supply voltage ($V_{SS}$). The device 60 is an eighth metal oxide semiconductor field effect transistor of the first conductivity type (for example, NMOSFET M8). A gate of the eighth transistor 60 (M8) is coupled to the gate of the seventh transistor 58 (M7), a drain of the eighth transistor 60 (M8) is couple to the bias node 48, and a source of the eighth transistor 60 (M8) is couple to the second supply voltage ($V_{SS}$).

In accordance with one embodiment of the present invention, as shown in FIG. 3, the first feedback circuit 36 includes two devices 50 and 64. It should be noted that the device 50 is the third transistor 50 (M3) that is also part of the mirror circuit 34 described above. The device 64 is a ninth metal oxide semiconductor field effect transistor of the second conductivity type (for example, PMOSFET M9). A gate of the ninth transistor 64 (M9) is coupled to the gate of the third transistor 50 (M3), a source of the ninth transistor 64 (M9) is couple to the first supply voltage ($V_{DD}$), and a drain of the ninth transistor 64 (M9) is coupled to the bias node 48.

As can be seen from FIG. 3, the amplifier circuit 20 includes two additional feedback paths (via the first and second feedback circuits 36 and 38) to the bias node 48. The main differential pair M1 and M2 (i.e., the first and second input devices 28 and 30) generates an error signal during normal negative feedback operation as a voltage follower circuit (from the output node 26 to the second input node 24). The same error signal is used to effectively bias the tail current (summed current i) flowing through the current source device 32 (M0) via the additional feedback paths through the transistors M6, M7, M8 and M9.

At steady state, there is no current flowing into the capacitor 40 ($C_c$) from the bias node 48, and the capacitor 40 just holds the required bias voltage at the gate of the current source device 32. As shown in FIG. 3, a positive feedback loop (path 1) is effectively formed through the path including the transistors 32 (M0), 28(M1), 50 (M3) and 64 (M9) to the bias node 48. The positive feedback loop corresponds to the first feedback circuit 36 supplying the mirrored first current $i_1$ to the bias node 48. A negative feedback loop (path 2) is also formed following the path including the transistors 32 (M0), 39 (M2), 54 (M5), 56 (M6), 58 (M7), and 60 (M8) to the bias node 48. The negative feedback loop corresponds to the second feedback circuit 38 which pulls the mirrored second current $i_2$ from the bias node 48. Thus, the capacitor 40 is charged in accordance with the current difference between the first and second current: $i_1-i_2$. The capacitor 40 provides the bias voltage Vb such that $i_1=i_2$, i.e., $V_{in}=V_o$, and thus effectively removes the systematic portion of the offset $\Delta I$. Stable operation is achieved by making sure that the overall negative feedback, including the negative feedback loop (path 3) trough transistors 28 (M1), 50 (M3), 52 (M4), and 30 (M2), is always higher than the positive feedback.

The summed current i is now always a fraction of the load current $I_L$. This will prevent any systematic offset from varying with bias, because the bias also scales with the load current. In fact the systematic offset present in the conventional amplifier such as the voltage follower circuit 10 (FIG. 2) is greatly diminished in accordance with the present embodiment. For example, a simulation of the amplifier circuit 20 showed a systematic offset of less than 200 $\mu$V for an input voltage ranging from 0.5 V to 1.5 V even when the PMOS current source (M4) supplying the load current $I_L$ is a minimum channel device. However, these numbers are by way of example and are not intended to be exhaustive or limiting in any way.

Compared with the conventional amplifier circuit, the self-bias on the tail current effectively increases the loop-gain of the single stage opamp by a factor of $g_{mx}r_{ds}$, where $r_{ds}$ is the resistance at the drain of the transistors M8 and M9 and $g_{mx}$ is the transconductance of the current source device M0. In addition, being able to use a minimum channel device for the PMOS current source (transistor M4) supplying the load current, the area of that device for a given drive requirement can be reduced. Reducing the area of that device also lowers the coupling of the output to $V_{DD}$ (through $C_{db}$ of M4, where $C_{db}$ is drain-to-bulk junction capacitance). In a more conservative design, the systematic offset can be further reduced by increasing the channel length of the transistors. The drop-out of the amplifier circuit is only one $V_{dsat}$ (where $V_{dsat}$ is the saturation voltage of the MOSFET) from the supply voltage, making this circuit suitable for low-voltage applications.

The frequency response of the amplifier circuit is examined using the small signal analysis. The grounded capacitor 40 ($C_c$) acts as a compensation capacitor. The overall response of the amplifier circuit 20 is that of a second order lowpass filter. A brief small signal analysis of the circuit is given below. The symbols in the following equations are those shown in FIG. 3 and have the same meanings.

The first current $i_1$, the second current $i_2$, the summed current (tail current) i, and the output voltage $V_o$ are expressed as:

$$i_1 = \frac{1}{2}[i + g_m(V_i - V_o)] \quad (1)$$

$$i_2 = \frac{1}{2}[i + g_m(V_i - V_o)] \quad (2)$$

$$i = g_{mx}\left[\frac{(i_1 - i_2)}{sC_c}\right] \quad (3)$$

$$V_o = \left[\frac{ki_1 R_L}{1 + sC_L R_L}\right] \quad (4)$$

By combining the equations (1)–(4) and simplifying the combination, the ratio of the input and output signals (the frequency response magnitude function) is obtained as:

$$\frac{V_o}{V_i} = \frac{\left[1 + \frac{sC_c}{g_{mx}}\right]}{\left[1 + s\left(\frac{C_c}{g_{mx}}\right)\left(1 + \frac{2}{kg_m R_L}\right) + s^2\left(\frac{2C_L C_c}{kg_m g_{mx}}\right)\right]} \quad (5)$$

which is a second order lowpass biquad function.

The f $\omega_0$ and Q are obtained from the above equation. For typical designs where $kg_m R_L>>2$, they are expressed as:

$$\omega_0 = \sqrt{\left(\frac{kg_m}{2C_L}\right)\left(\frac{g_{mx}}{C_c}\right)} \quad (6)$$

$$Q = \sqrt{\left(\frac{g_{mx}}{C_c}\right)/\left(\frac{kg_m}{2C_L}\right)} \quad (7)$$

The equations (6) and (7) (which incidentally are independent of $R_L$) give insight to the parameters which will affect the stability and speed of the amplifier. By sizing the $g_{mx}$ and $C_c$ appropriately with respect to $g_m$ and $C_L$ we can achieve the required stable operation at a given speed. As expected, with increasing $C_c$ the stability improves but the overall speed also reduces. In the above analysis we assumed that the pole formed by the mirror circuit transistors M3 and M5 is far from the unity-gain frequency of the loop.

Regarding the power supply rejection ration (PSRR), the transfer function from the power supply terminal to the regulated output looks like a bandpass filter, rejecting DC as well as high frequencies. Intuitively, this comes from the fact that at DC and up to the bandwidth of the amplifier the feedback circuit actively tries to make $V_o=V_{in}$, by adjusting the first and second currents to be equal (i.e., $i_1=i_2$) independent of the changes in the first supply voltage (power supply) $V_{DD}$. Since the tail current bias voltage (bias node) is coupled to the second supply voltage (ground) $V_{SS}$ by the capacitor $C_c$, it is well isolated from the first supply voltage $V_{DD}$. At higher frequencies, beyond the unity-gain frequency of the amplifier, when the feedback is no longer effective, the load capacitance rolls off the gain from $V_{DD}$, by effectively "clamping" the output to $V_{SS}$. Hence we see the bandpass-like transfer function from $V_{DD}$ to the output. For a high bandwidth a low value load capacitor is desirable at the output, however, a larger capacitor at the output is desirable for a good PSRR. Accordingly, by appropriately choosing the load capacitor $C_L$ for a given load resistance $R_L$ and bandwidth requirement, good PSRR performance is achieved.

In accordance with one embodiment of the present invention, as shown in FIG. 3, the amplifier circuit 20 further includes a startup circuit 66 coupled to the bias node 48. The startup circuit 66 supplies a startup current to provide a desirable bias point. In general, no bias voltages or currents are necessary for the operation of the amplifier circuit. As long as the input voltage $V_{in}$ and a finite load resistance $R_L$ exist, there will be load current present and that will ensure a proper tail current bias voltage. However, because of the self-biased operation a startup circuit 66 may be provided to the amplifier circuit. An ideal point for injecting a startup current (which will be switched off during the normal operation) would be the high impedance point at $C_c$. The startup circuit 66 may also clamp the bias voltage from going too low, so that the tail current does not shut off. The circuit goes into a standby mode during extreme switching transients. The startup circuit 66 may be used to bring the amplifier circuit 20 to operate at a desirable bias point.

As described above, the bias point of the amplifier circuit is dependent on the load current itself as a result of the self-biasing. In fact, as the load current increases the bias also increases, which results in an increase in $\omega_0$ as seen from the equation (6). The Q-value (or circuit damping) is held constant because it is a ratio of matched parameters, as understood from the equation (7). The increase in the speed of the amplifier circuit with the load current may indeed be desirable in certain applications.

FIG. 4 schematically illustrates an amplifier circuit 120 in accordance with one embodiment of the present invention. In this embodiment, the positive feedback and negative feedback to the bias node are provided in terms of additional current mirror circuits. As shown in FIG. 4, the amplifier circuit 120 includes a first input node 122, a second input node 124, an output node 126 coupled to the second input node 124, a first input device 128 (M1), a second input device 130 (M2), a current source device 132 (M0), and a first mirror circuit 134. The first input node 122 is typically coupled to a non-inverting terminal and the second input node 124 is coupled to an inverting terminal. The amplifier circuit 120 further includes a second mirror circuit 136, a third mirror circuit 137, a fourth mirror circuit 138, and a capacitor 140.

The first input device 128 is coupled to the first input node 122, and controls a first current $i_1$ flowing from the supply voltage $V_{DD}$ through a first node to a summing node 144. The second input device 130 is coupled to the second input node 124, and controls a second current $i_2$ flowing from the first supply voltage $V_{DD}$ through a second node 146 to the summing node 144. The current source device 132 is coupled to a bias node 148, and controls a summed current $i$ flowing from the summing node 144 to the second supply voltage $V_{SS}$. The first current mirror circuit 134 is coupled between the first supply voltage $V_{DD}$ and the first node 142 and to the output node 126. The first current mirror circuit 134 generates a load current $I_L$ mirroring the first current $i_1$ (with factor of the device ratio k) to provide an output signal voltage $V_o$ to the output node 126.

The second current mirror circuit 136 is coupled between the first supply voltage $V_{DD}$ and a third node 147 and to the second node 146. The second current mirror circuit 136 provides a mirrored second current ($i_2$) to the third node 147. The third current mirror circuit 137 is coupled between the third node 147 and the second supply voltage $V_{SS}$ and to the bias node 148. The third current mirror circuit 137 mirrors the second current flowing through the third node 147 to a current flowing through the bias node 148, so as to pull the mirrored second current ($i_2$) from the bias node 148. The fourth current mirror circuit 138 us coupled between the first supply voltage $V_{DD}$ and the first node 142 and to the bias node 148. The fourth current mirror circuit 138 mirrors the first current $i_1$ and supplies the mirrored first current ($i_1$) to the bias node 148. The capacitor 140 is coupled between the bias node 148 and the second supply voltage $V_{SS}$. The capacitor 140 is charged by the current difference between the first and second currents ($i_1-i_2$), and provides the current source device 132 with a bias voltage Vb in accordance with its electric charge.

As shown in FIG. 4, the first current mirror circuit 134 includes a pair of transistors (PMOS) M3 and M4 with the device ratio of 1:k in the same manner as the current mirror circuit 34 in FIG. 3. Similarly, the second current mirror circuit 136 includes a pair of transistors (PMOS) M5 and M6, the third current mirror circuit 137 includes a pair of transistors (NMOS) M7 and M8, and the fourth current mirror circuit 138 includes a pair of transistors (PMOS) M3 and M9. The device ratio of these transistor pairs in the second to fourth current mirror circuits 136–138 is typically set to 1. The transistor M3 also operates as part of the first current mirror circuit 134. It should be noted that the fourth current mirror circuit 138 functions as a positive feedback circuit (the first feedback circuit 36) in the previous embodiment shown in FIG. 3. Also, the combination of the second and third current mirror circuits 136 and 137 operates as a negative feedback circuit (the second feedback circuit 38 in FIG. 3) as described above. The CMOS implementation of the amplifier circuit 120 may be the same as that of the amplifier circuit 20. In addition, a startup circuit 166 may also be provided to the amplifier circuit 120 in the similar manner as described above.

FIG. 5 schematically illustrates a method for self-biasing an amplifier circuit in accordance with one embodiment of the present invention. The amplifier circuit includes a first input node, a second input node, and an output node. The amplifier circuit may be the amplifier circuit 20 or 120 as described above. First, an input signal voltage $V_{in}$ is received at the first input node (200). A first current flowing from a first supply voltage to a summing node is controlled in accordance with the input signal voltage at the first input node (202). A load current is generated by mirroring the first current (204), and is supplied to the output node so as to provide an output signal voltage to the output node (206). The output signal voltage is fed-back to the second input node (208), and a second current flowing from the first supply voltage to the summing node is controlled in accordance with the output signal voltage at the second input node (210). The first current is also mirrored to generate a mirrored first current (212). Similarly, the second current is mirrored so as to generate a mirrored second current (214). These mirrored currents are fed-back and the difference of the mirrored first current and the mirrored second current is supplied to a capacitor coupled to a second supply voltage (typically, a grounded capacitor) (216), so that the capacitor provides a bias voltage in accordance with an electric charge held therein (218). A summed current of the first and second currents flowing from the summing node to the second supply voltage is controlled in accordance with the bias voltage (220). Thus, the amplifier circuit is biased off the load itself thereby increasing accuracy and at the same time the structure remains simple enough to be compensated easily.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An amplifier circuit comprising:
   a first input device coupled to a first input node, said first input device controlling a first current flowing from a first supply voltage through a first node to a summing node;
   a second input device coupled to a second input node, said second input device controlling a second current flowing from the first supply voltage through a second node to the summing node;
   a current source device coupled to a bias node, said current source device controlling a summed current flowing from the summing node to a second supply voltage in accordance with a bias voltage;
   a current mirror circuit coupled between the first supply voltage and the first node and to an output node, said current mirror circuit generating a load current mirroring the first current to provide an output signal voltage to said output node, said output node also coupled to said second input node;
   a first feedback circuit coupled between the first supply voltage and the first node and to the bias node, said first feedback circuit supplying a mirrored first current to the bias node;
   a second feedback circuit coupled between the second node and the second supply voltage and to the bias node, said second feedback circuit pulling a mirrored second current from the bias node; and
   a capacitor coupled between the bias node and the second supply voltage, said capacitor providing the bias voltage to said current source device.

2. An amplifier circuit in accordance with claim 1 wherein said first input node is coupled to a non-inverting terminal and said second input node is coupled to an inverting terminal.

3. An amplifier circuit in accordance with claim 1 wherein said second supply voltage is a ground voltage.

4. An amplifier circuit in accordance with claim 1 wherein said first input device is a first metal oxide semiconductor field effect transistor of a first conductivity type, a gate of the first transistor being coupled to said first input node, a drain of the first transistor being coupled to the first node, and a source of the first transistor being coupled to the summing node.

5. An amplifier circuit in accordance with claim 1 wherein said second input device is a second metal oxide semiconductor field effect transistor of a first conductivity type, a gate of the second transistor being coupled to said second input node, a drain of the second transistor being coupled to the second node, and a source of the second transistor being coupled to the summing node.

6. An amplifier circuit in accordance with claim 1 wherein said current source device is a metal oxide semiconductor field effect transistor of a first conductivity type, a gate of the transistor being coupled to the bias node, a drain of the transistor being coupled to the summing node, and a source of the transistor being coupled to the second supply voltage.

7. An amplifier circuit in accordance with claim 1 wherein said current mirror circuit includes:
   a third metal oxide semiconductor field effect transistor of a second conductivity type, a gate and a drain of the third transistor being coupled to the first node, and a source of the third transistor being coupled to the first supply voltage; and
   a fourth metal oxide semiconductor field effect transistor of the second conductivity type, a gate of the fourth transistor being coupled to the first node, a source of the fourth transistor being couple to the first supply voltage, and a drain of the fourth transistor being coupled to said output node.

8. An amplifier circuit in accordance with claim 7 wherein said third transistor and said fourth transistor have a device ratio of 1:k.

9. An amplifier circuit in accordance with claim 1 wherein said second feedback circuit includes:
   a fifth metal oxide semiconductor field effect transistor of a second conductivity type, a gate and a drain of the fifth transistor being coupled to the second node, and a source of the fifth transistor being coupled to the first supply voltage;
   a sixth metal oxide semiconductor field effect transistor of the second conductivity type, a gate of the sixth transistor being coupled to the gate of the fifth transistor, a source of the sixth transistor being couple to the first supply voltage, and a drain of the sixth transistor being coupled to a third node;
   a seventh metal oxide semiconductor field effect transistor of a first conductivity type, a gate and a drain of the seventh transistor being coupled to the third node, and a source of the seventh transistor being coupled to the second supply voltage; and
   an eighth metal oxide semiconductor field effect transistor of the first conductivity type, a gate of the eighth transistor being coupled to the gate of the seventh transistor, a drain of the eighth transistor being couple to the bias node, and a source of the eighth transistor being couple to the second supply voltage.

10. An amplifier circuit in accordance with claim 1 wherein said first feedback circuit includes:
    a third metal oxide semiconductor field effect transistor of a second conductivity type, a gate and a drain of the third transistor being coupled to the first node, and a source of the third transistor being coupled to the first supply voltage; and
    a ninth metal oxide semiconductor field effect transistor of the second conductivity type, a gate of the ninth transistor being coupled to the gate of the third transistor, a source of the ninth transistor being couple to the first supply voltage, and a drain of the ninth transistor being coupled to the bias node.

11. An amplifier circuit in accordance with claim 1, further comprising:
    a startup circuit coupled to the bias node, said startup circuit supplying a startup current to provide a desirable bias point.

12. An amplifier circuit comprising:
    a first input device coupled to a first input node, said first input device controlling a first current flowing from the a supply voltage through a first node to a summing node;
    a second input device coupled to a second input node, said second input device controlling a second current flowing from the first supply voltage through a second node to the summing node;

a current source device coupled to a bias node, said current source device controlling a summed current flowing from the summing node to the second supply voltage;

a first current mirror circuit coupled between the first supply voltage and the first node and to an output node, said first current mirror circuit generating a load current mirroring the first current to provide an output signal voltage to said output node, said output node also coupled to said second input node;

a second current mirror circuit coupled between the first supply voltage and a third node and to the second node, said second current mirror circuit providing a mirrored second current to the third node;

a third current mirror circuit coupled between the third node and the second supply voltage and to said bias node, said third current mirror circuit pulling a mirrored second current from the bias node;

a fourth current mirror circuit coupled between the first supply voltage and the first node and to the bias node, said fourth current mirror circuit supplying a mirrored first current to the bias node; and a capacitor coupled between the bias node and the second supply voltage, said capacitor providing a bias voltage to said current source device.

13. An amplifier circuit in accordance with claim 12 wherein said first input node is couple to a non-inverting terminal and said second input node is coupled to an inverting terminal.

14. An amplifier circuit in accordance with claim 12 wherein said second supply voltage is a ground voltage.

15. An amplifier circuit in accordance with claim 12 wherein said first input device is a first metal oxide semiconductor field effect transistor of a first conductivity type, a gate of the first transistor being coupled to said first input node, a drain of the first transistor being coupled to the first node, and a source of the first transistor being coupled to the summing node.

16. An amplifier circuit in accordance with claim 12 wherein said second input device is a second metal oxide semiconductor field effect transistor of a first conductivity type, a gate of the second transistor being coupled to said second input node, a drain of the second transistor being coupled to the second node, and a source of the second transistor being coupled to the summing node.

17. An amplifier circuit in accordance with claim 12 wherein said current source device is a metal oxide semiconductor field effect transistor of a first conductivity type, a gate of the transistor being coupled to the bias node, a drain of the transistor being coupled to the summing node, and a source of the transistor being coupled to the second supply voltage.

18. An amplifier circuit in accordance with claim 12 wherein said first current mirror circuit includes:

a third metal oxide semiconductor field effect transistor of a second conductivity type, a gate and a drain of the third transistor being coupled to the first node, and a source of the third transistor being coupled to the first supply voltage; and a fourth metal oxide semiconductor field effect transistor of the second conductivity type, a gate of the fourth transistor being coupled to the first node, a source of the fourth transistor being couple to the first supply voltage, and a drain of the fourth transistor being coupled to said output node.

19. An amplifier circuit in accordance with claim 18 wherein said third transistor and said fourth transistor have a device ratio of 1:k.

20. An amplifier circuit in accordance with claim 12 wherein said second current mirror circuit includes:

a fifth metal oxide semiconductor field effect transistor of a second conductivity type, a gate and a drain of the fifth transistor being coupled to the second node, and a source of the fifth transistor being coupled to the first supply voltage; and a sixth metal oxide semiconductor field effect transistor of the second conductivity type, a gate of the sixth transistor being coupled to the gate of the fifth transistor, a source of the sixth transistor being couple to the first supply voltage, and a drain of the sixth transistor being coupled to the third node.

21. An amplifier circuit in accordance with claim 12 wherein said third current mirror circuit includes:

a seventh metal oxide semiconductor field effect transistor of a first conductivity type, a gate and a drain of the seventh transistor being coupled to the third node, and a source of the seventh transistor being coupled to the second supply voltage; and an eighth metal oxide semiconductor field effect transistor of the first conductivity type, a gate of the eighth transistor being coupled to the gate of the seventh transistor, a drain of the eighth transistor being couple to the bias node, and a source of the eighth transistor being couple to the second supply voltage.

22. An amplifier circuit in accordance with claim 12 wherein said fourth current mirror circuit includes:

a third metal oxide semiconductor field effect transistor of a second conductivity type, a gate and a drain of the third transistor being coupled to the first node, and a source of the third transistor being coupled to the first supply voltage; and a ninth metal oxide semiconductor field effect transistor of the second conductivity type, a gate of the ninth transistor being coupled to the gate of the third transistor, a source of the ninth transistor being couple to the first supply voltage, and a drain of the ninth transistor being coupled to the bias node.

23. An amplifier circuit in accordance with claim 12, further comprising:

a startup circuit coupled to the bias node, said startup circuit supplying a startup current to provide a desirable bias point.

24. An amplifier circuit comprising:

a first transistor of a first conductivity type, a gate of the first transistor being coupled to a first input node, a drain of the first transistor being coupled to the first node, and a source of the first transistor being coupled to the summing node;

a second transistor of the first conductivity type, a gate of the second transistor being coupled to a second input node, a drain of the second transistor being coupled to the second node, and a source of the second transistor being coupled to the summing node;

a current source transistor of the first conductivity type, a gate of the current source transistor being coupled to the bias node, a drain of the current source transistor being coupled to the summing node, and a source of the current source transistor being coupled to the second supply voltage;

a third transistor of a second conductivity type, a gate and a drain of the third transistor being coupled to the first node, and a source of the third transistor being coupled to the first supply voltage; and a fourth transistor of the second conductivity type, a gate of the fourth transistor being coupled to the first node, a source of the fourth transistor being couple to the first supply voltage, and a drain of the fourth transistor being coupled to an output node, the output node also coupled to the second input node;

a fifth transistor of the second conductivity type, a gate and a drain of the fifth transistor being coupled to the second node, and a source of the fifth transistor being coupled to the first supply voltage;

a sixth metal oxide semiconductor field effect transistor of the second conductivity type, a gate of the sixth transistor being coupled to the gate of the fifth transistor, a source of the sixth transistor being couple to the first supply voltage, and a drain of the sixth transistor being coupled to the third node;

a seventh transistor of the first conductivity type, a gate and a drain of the seventh transistor being coupled to the third node, and a source of the seventh transistor being coupled to the second supply voltage;

an eighth transistor of the first conductivity type, a gate of the eighth transistor being coupled to the gate of the seventh transistor, a drain of the eighth transistor being coupled to the bias node, and a source of the eighth transistor being couple to the second supply voltage;

a ninth transistor of the second conductivity type, a gate of the ninth transistor being coupled to the gate of the third transistor, a source of the ninth transistor being couple to the first supply voltage, and a drain of the ninth transistor being coupled to the bias node; and a capacitor coupled between the bias node and the second supply voltage, said capacitor providing the bias voltage to said current source device.

25. An amplifier circuit in accordance with claim 24 wherein said transistors of the first type are N-type metal oxide semiconductor field effect transistors, and said transistors of the second type are P-type metal oxide semiconductor field effect transistors.

26. A method for self-biasing an amplifier circuit including a first input node, a second input node, and an output node, said method comprising:

receiving an input signal voltage at the first input node;

controlling a first current flowing from a first supply voltage to a summing node in accordance with the input signal voltage at the first input node;

generating a load current by mirroring the first current and supplying the load current to the output node to provide an output signal voltage to the output node;

feeding back the output signal voltage to the second input node;

controlling a second current flowing from the first supply voltage to the summing node in accordance with the output signal voltage at the second input node;

generating a mirrored first current by mirroring the first current;

generating a mirrored second current by mirroring the second current;

supplying a difference of the mirrored first current and the mirrored second current to a capacitor coupled to a second supply voltage, the capacitor providing a bias voltage in accordance with an electric charge held therein; and controlling a summed current flowing from the summing node to the second supply voltage in accordance with the bias voltage.

27. A method in accordance with claim 26 wherein said first input node is coupled to a non-inverting terminal and said second input node is coupled to an inverting terminal.

* * * * *

UNITED STATES PATENT AND TRADEMARK OFFICE
CERTIFICATE OF CORRECTION

PATENT NO. : 6,642,791 B1
DATED : November 4, 2003
INVENTOR(S) : Balan, Vishnu

It is certified that error appears in the above-identified patent and that said Letters Patent is hereby corrected as shown below:

<u>Title page,</u>
Item [54], Title, change "SELF-BASING" to -- SELF-BIASING --.

Signed and Sealed this

Sixth Day of July, 2004

JON W. DUDAS
*Acting Director of the United States Patent and Trademark Office*